(12) United States Patent
Inobe

(10) Patent No.: US 10,797,100 B2
(45) Date of Patent: Oct. 6, 2020

(54) IMAGING DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Ryuta Inobe, Fujisawa Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/295,538

(22) Filed: Mar. 7, 2019

(65) Prior Publication Data

US 2020/0083279 A1 Mar. 12, 2020

(30) Foreign Application Priority Data

Sep. 12, 2018 (JP) ................................. 2018-170730

(51) Int. Cl.
*H01L 27/148* (2006.01)
*H01L 27/146* (2006.01)

(52) U.S. Cl.
CPC .... *H01L 27/14806* (2013.01); *H01L 27/1461* (2013.01); *H01L 27/14603* (2013.01); *H01L 27/14605* (2013.01); *H01L 27/14612* (2013.01); *H01L 27/14614* (2013.01); *H01L 27/14643* (2013.01); *H01L 27/14825* (2013.01)

(58) Field of Classification Search
CPC .................... H01L 27/14609; H01L 27/14612
See application file for complete search history.

(56) References Cited

U.S. PATENT DOCUMENTS

| 10,020,333 B2 | 7/2018 | Kuwazawa et al. |
| 2007/0235827 A1* | 10/2007 | Altice ............... H01L 27/14609 |
| | | 257/428 |
| 2009/0046186 A1 | 2/2009 | Nagai |
| 2017/0330904 A1* | 11/2017 | Kuwazawa ....... H01L 27/14643 |

FOREIGN PATENT DOCUMENTS

| JP | H4-177763 A | 6/1992 |
| JP | 2007-74421 A | 3/2007 |
| JP | 2009-038263 A | 2/2009 |
| JP | 2010-182759 A | 8/2010 |
| JP | 2013-153091 A | 8/2013 |
| JP | 2017-204528 A | 11/2017 |

* cited by examiner

*Primary Examiner* — Farun Lu
(74) *Attorney, Agent, or Firm* — White & Case LLP

(57) ABSTRACT

An imaging device includes a semiconductor substrate, pixels, a charge detector, charge storage portions, an output gate portion and a shift gate portion. The pixels and the charge detector are provided in the semiconductor substrate. The charge storage portions are provided on the charge detector side of the pixels, and linked to the pixels. The output gate portion is positioned between the charge detector and the charge storage portions, and includes charge transfer channels extending in a radial configuration in directions from the charge detector toward the pixels. The shift gate portion is positioned between one charge storage portion and one charge transfer channel. The shift gate portion includes a gate electrode provided on the semiconductor substrate. A planar configuration of the gate electrode has a side orthogonal to the extending direction of the one charge transfer channels, the side being most proximal to the one charge transfer channel.

14 Claims, 7 Drawing Sheets

IMAGING DEVICE

CROSS-REFERENCE TO RELATED APPLICATIONS

This application is based upon and claims the benefit of priority from Japanese Patent Application No. 2018-170730, filed on Sep. 12, 2018; the entire contents of which are incorporated herein by reference.

FIELD

Embodiments relate to an imaging device.

BACKGROUND

For example, an imaging device includes multiple pixels; and it is desirable for the imaging device to output signals generated by the photoelectric conversion in the pixels at the prescribed timing without a delay.

DETAILED DESCRIPTION

Figure 1:
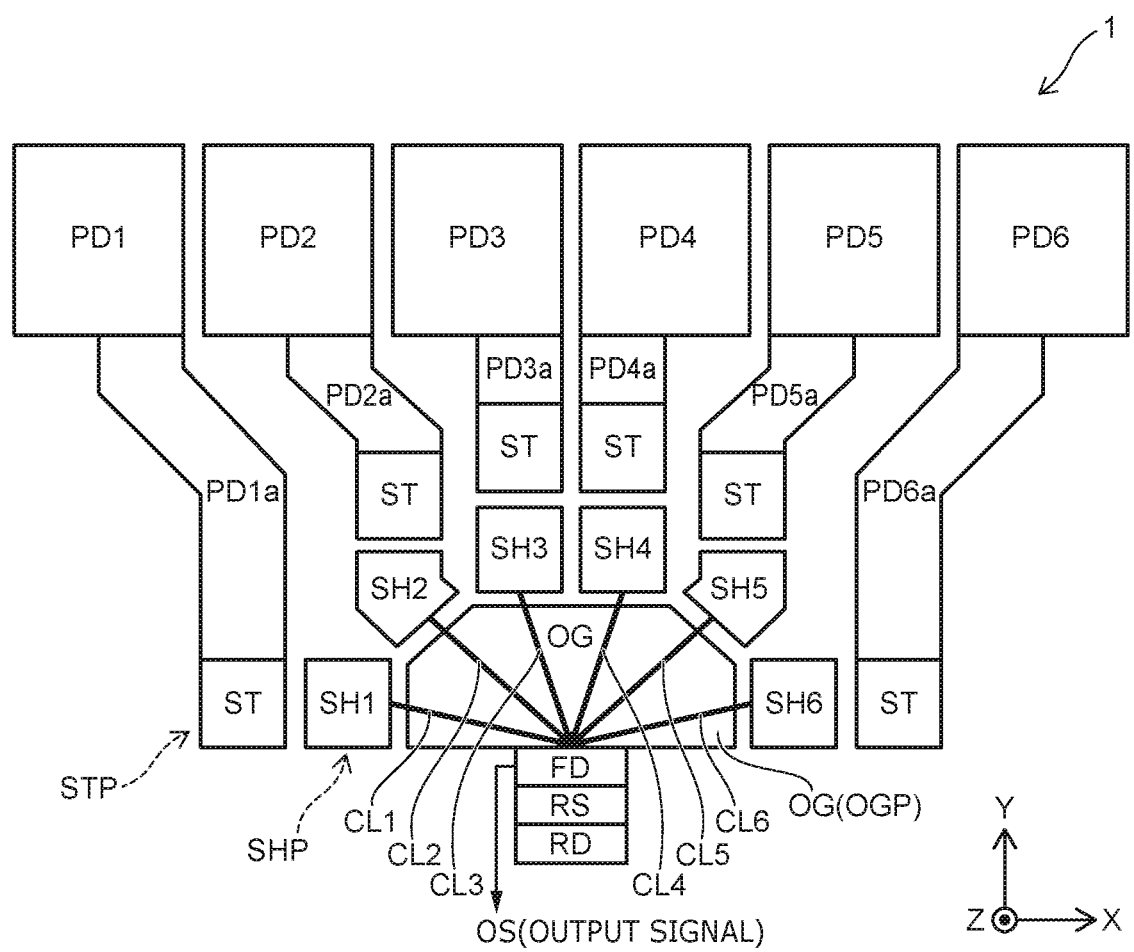
FIG. 1 is a schematic view showing an imaging device according to a first embodiment.

According to an embodiment, an imaging device includes a semiconductor substrate, a plurality of pixels, a charge detector, a plurality of charge storage portions, an output gate portion and a shift gate portion. The plurality of pixels are provided in the semiconductor substrate and arranged in a first direction along a front surface of the semiconductor substrate. The charge detector is provided in the semiconductor substrate, the charge detector being provided at a position separated from a column of the plurality of pixels in a second direction orthogonal to the first direction. The plurality of charge storage portions are provided on the charge detector side of the column of the plurality of pixels, the plurality of charge storage portions being linked respectively to the plurality of pixels via charge transfer portions. The output gate portion is positioned between the charge detector and the plurality of charge storage portions, the output gate portion including a plurality of charge transfer channels extending in a radial configuration in directions from the charge detector toward the column of the plurality of pixels. The shift gate portion is positioned between one of the plurality of charge storage portions and a charge transfer channel of the plurality of charge transfer channels, the charge transfer channel extending in a third direction crossing the first direction and the second direction. The shift gate portion includes a gate electrode provided on the semiconductor substrate. A planar configuration of the gate electrode has a side orthogonal to the third direction, the side being most proximal to the charge transfer channel extending in the third direction.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic view showing an imaging device 1 according to a first embodiment. The imaging device 1 is, for example, a so-called linear image sensor in which multiple pixels PD are arranged in the X-direction.

The imaging device 1 includes six pixels PD1 to PD6 and a charge detector FD. For example, the pixels PD1 to PD6 are arranged in the X-direction. The charge detector FD is provided at a position separated in the −Y direction (the reverse direction of the Y-direction) from the column (hereinbelow, the pixel column) of the pixels PD1 to PD6.

For example, the components of the imaging device 1 are arranged with line symmetry with respect to a line passing through the charge detector FD and extending in the Y-direction. This is similar for the other examples as well. In the description hereinbelow, there are cases where the pixels PD1 to PD6 are differentiated in the description and cases where the pixels PD1 to PD6 are described comprehensively as the pixel PD. This is similar for the other components as well.

The imaging device 1 further includes charge transfer portions PD1a to PD6a, six charge storage portions STP, six shift gate portions SHP, and an output gate portion OGP. The charge storage portions STP each include a storage gate ST. The shift gate portions SHP include shift gates SH1 to SH6.

The output gate portion OGP is provided at the vicinity of the charge detector FD. The output gate portion OGP is positioned between the pixel column and the charge detector FD. The output gate portion OGP includes an output gate OG.

The six pixels PD1 to PD6 are connected respectively to the charge storage portions STP via the charge transfer portions PD1a to PD6a. The charge generated by the photoelectric conversion in a pixel PD is transferred to a charge storage portion STP via a charge transfer portion PDa and is stored temporarily in the charge storage portion STP. Further, the charge in the charge storage portion STP is transferred to the charge detector FD via a shift gate portion SHP and the output gate portion OGP. Thereby, the potential of the charge detector FD changes; and the charge detector FD outputs a signal corresponding to the potential change of the charge detector ED.

The imaging device 1 further includes a reset gate RS and a reset drain RD. The reset gate RS and the reset drain RD are disposed proximally to the charge detector FD. The reset gate RS operates to discharge the charge to the reset drain RD, which is transferred to the charge detector FD. Thereby, the charge detector ED returns to the initial state.

The six storage gates ST, the shift gates SH1 to SH6, and the output gate OG are shown in FIG. 1. The charge storage portions STP are provided at the positions of the storage gates ST. The shift gate portions SHP are provided respectively at the positions of the shift gates SH1 to SH6. The output gate portion OGP is provided at the position of the output gate OG.

As shown in FIG. 1, the shift gates SH1 to SH6 are arranged along the outer edge of the output gate OG on the pixel column side. The shift gates SH1 to SH6 are arranged respectively between the output gate OG and the storage gates ST.

The output gate portion OGP includes charge transfer channels CL1 to CL6 linking the shift gate portions SHP to the charge detector ED. For example, the shift gate portions SHP are arranged so that the distances to the charge detector ED through the respective charge transfer channels are substantially equal.

Figure 2A:
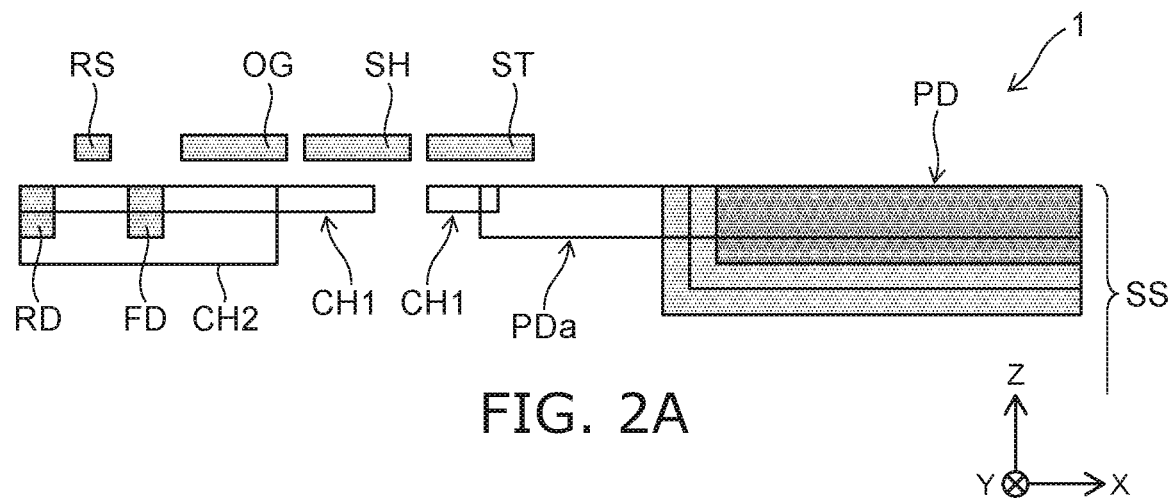
FIGS. 2A and 2B are schematic views showing the structure of the imaging device according to the first embodiment.
Figure 2B:
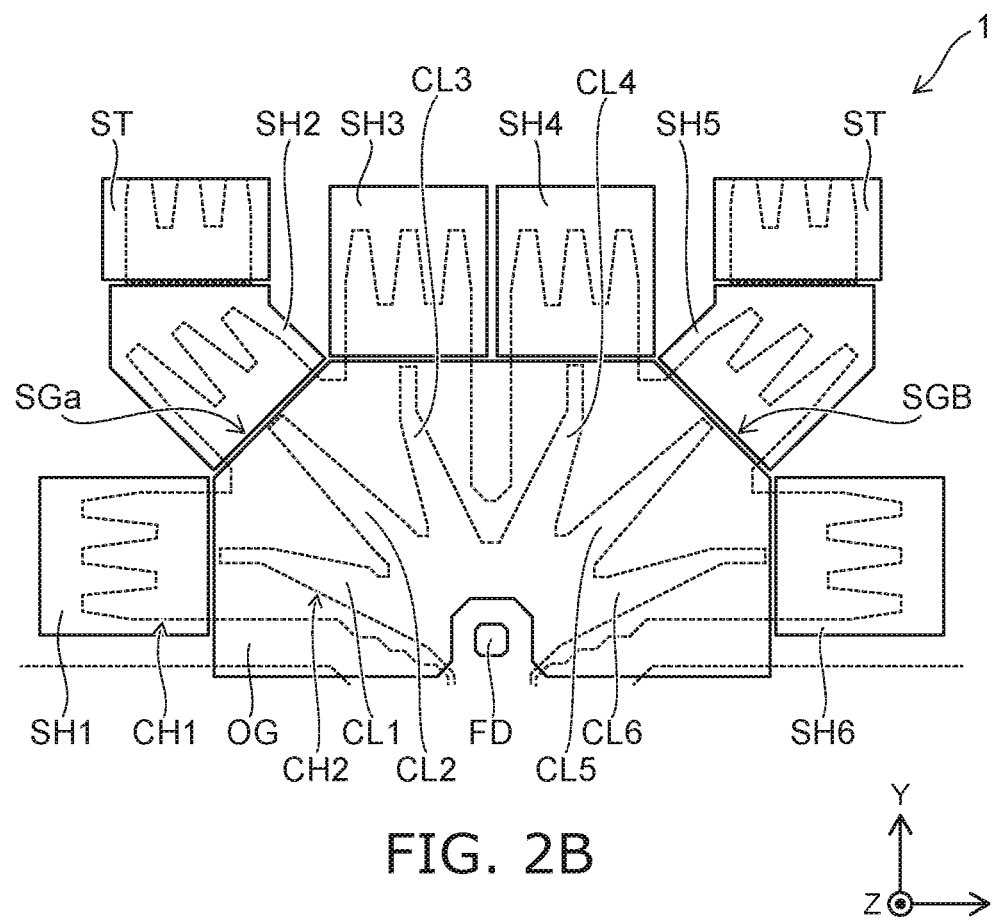

FIGS. 2A and 2B are schematic views showing the structure of the imaging device 1 according to the first embodiment. FIG. 2A is a schematic view showing an X-Z cross section of the imaging device 1. FIG. 2B is a plan view illustrating the configuration of the output gate portion OGP and the shift gate portions SHP.

As shown in FIG. 2A, the imaging device 1 includes the pixel PD, the charge transfer portion PDa, a channel CH1, a channel CH2, the charge detector FD, the reset gate RS, and the reset drain RD. The pixel PD, the charge transfer portion PDa, the channels CH1 and CH2, the charge detector FD, and the reset drain RD are provided in the surface layer of a semiconductor substrate SS. The semiconductor substrate SS is, for example, a silicon substrate. Also, the pixel PD and the channels CH1 and CH2 may be provided in a silicon layer epitaxially grown on the semiconductor substrate SS. The semiconductor substrate SS is not limited to a silicon substrate and may be, for example, a compound semiconductor substrate.

For example, an insulating film (not-illustrated) is provided on the semiconductor substrate SS; and the storage gate ST, the shift gate SH, the output gate OG, and the reset gate RS are provided on the insulating film. For example, the charge storage portion STP includes the storage gate ST and a portion positioned directly under the storage gate ST. The shift gate portion SHP includes the shift gate SH and a portion positioned directly under the shift gate SH. The output gate portion OGP includes the output gate OG and a portion positioned directly under the output gate OG.

As shown in FIG. 2B, the channel CH2 that is positioned directly under the output gate OG is provided to extend in a radial configuration having the charge detector FD as the center. The portions of the channel CH2 extend in the radial configuration, which correspond respectively to the charge transfer channels CL1 to CL6.

The charge transfer channels CL1 to CL6 extend toward the shift gates SH1 to SH6. The shift gates SH1 to SH6 each are provided so that, for example, the sides of the shift gates SH1 to SH6 which are positioned proximal to the tips of the charge transfer channels CL, respectively, in the planar configuration are orthogonal or substantially orthogonal to each extension direction of the tips of the charge transfer channels CL. Thereby, the charge transfer rates can be provided uniformly for the charges transferred from the shift gate portions SHP to the charge detector FD via the charge transfer channels CL. For example, the charge transfer rates may vary in the case where the crossing angles of the extension directions of the tips of the charge transfer channels CL and the sides of the shift gates SH are diverse. Thus, there are cases where it is difficult in the charge detector FD to set the timing of signal detection.

Figure 3:
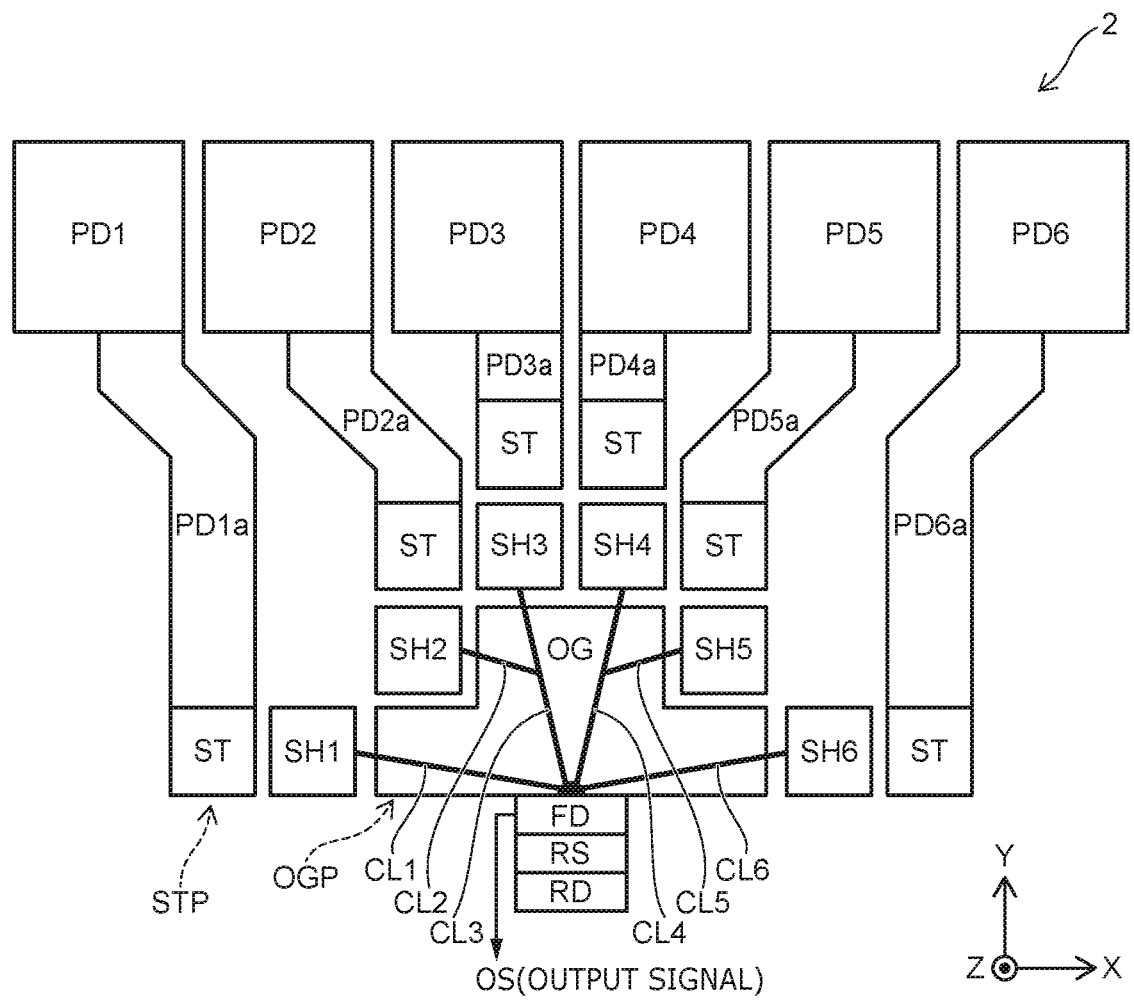
FIG. 3 is a schematic view showing an imaging device according to a comparative example.

FIG. 3 is a schematic view showing an imaging device 2 according to a comparative example. The imaging device 2 includes the charge detector FD and the six pixels PD1 to PD6 arranged in the X-direction. The charge detector FD is provided at a position separated in the −Y direction from the pixel column.

In the imaging device 2 as shown in FIG. 3, the configurations of the shift gates SH are quadrilaterals having sides extending in the X-direction and the Y-direction. The shift gates SH transfer the charges stored in the charge storage portions STP uniformly via the charge transfer channels CL without the charge decreasing. The shift gates SH are provided to have constant surface areas and side lengths. Further, the shift gates SH are disposed proximally to the charge detector FD to shorten the distances to the charge detector FD from the shift gates SH.

On the other hand, the charge transfer channels CL1 to CL6 that are provided in the output gate portion OGP are provided so that the distances to the charge detector FD from the shift gates SH are uniform. Further, the tips of the charge transfer channels CL are provided to extend in directions orthogonal to the sides of the shift gates SH. As a result, as shown in FIG. 3, the charge transfer channel CL2 is provided to branch from the charge transfer channel CL3, where the charge transfer channel CL2 connects the charge detector FD to the shift gate portion SHP including the shift gate SH2, and the charge transfer channel CL3 connects the charge detector FD to the shift gate portion SHP including the shift gate SH3. Also, the charge transfer channel CL5 is provided to branch from the charge transfer channel CL4, where the charge transfer channel CL5 connects the charge detector FD to the shift gate portion SHP including the shift gate SH5, and the charge transfer channel CL4 connects the charge detector FD to the shift gate portion SHP including the shift gate SH4.

In the imaging device 2, due to such an arrangement of the shift gate portions SHP and the charge transfer channels CL, the distances to the charge detector FD from the shift gate portions SHP are longer than the distances to the charge detector FD from the shift gate portions SHP in the imaging device 1.

Figure 4A:
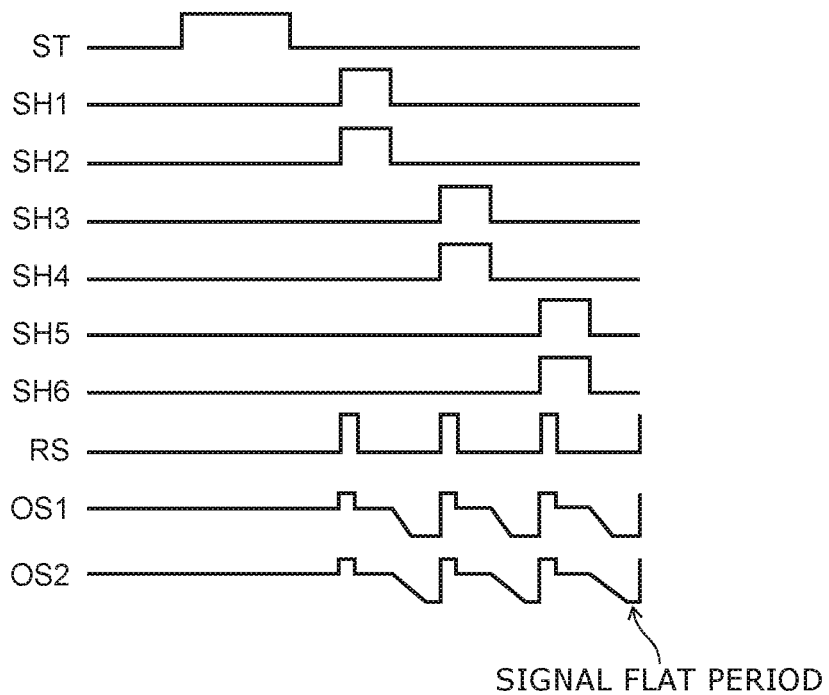
FIGS. 4A and 4B are timing charts showing operations of the imaging device according to the first embodiment.
Figure 4B:
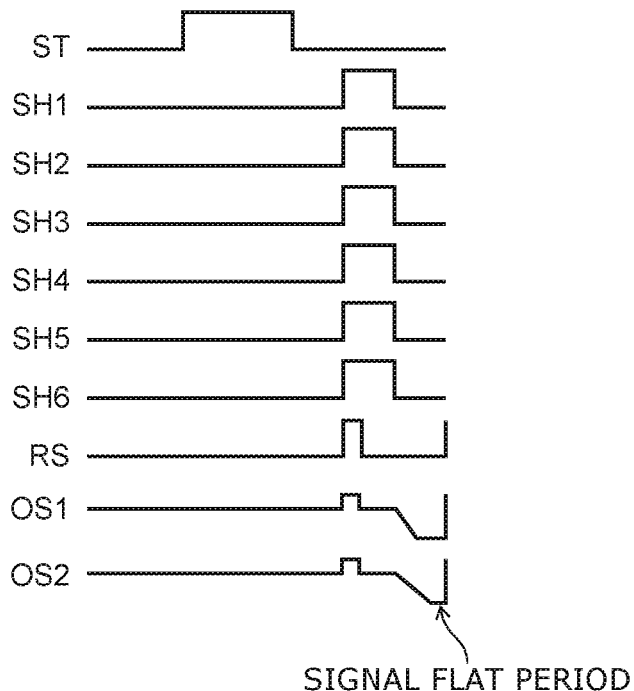

FIGS. 4A and 4B are timing charts showing operations of the imaging device 1 according to the first embodiment. FIG. 4A illustrates the operation in which the timing of applying the voltages to the shift gates SH is delayed in order. FIG. 4B illustrates the operation in which the voltages are applied simultaneously to the six shift gates SH.

As shown in FIG. 4A, the gate voltages are applied to the storage gates ST. Thereby, the charges generated by the photoelectric conversion in the pixels PD1 to PD6 are transferred to the charge storage portions STP via the charge transfer portions PD1a to PD6a.

Then, the gate voltages are applied to the shift gates SH1 and SH2; and the charges are transferred from the charge storage portions STP to the charge detector FD via the charge transfer channels CL1 and CL2. Thereby, a signal corresponding to the charges of the photoelectric conversion in the pixels PD1 and PD2 are output from the charge detector FD.

Then, voltages are applied to the shift gates SH3 and SH4 after a prescribed time interval. The shift gates SH1 and SH2 are set to OFF at this timing. Thereby, the charges are transferred from the charge storage portions STP to the charge detector FD via the charge transfer channels CO and CL4. The charge detector FD outputs a signal corresponding to the charges of the photoelectric conversion in the pixels PD3 and PD4.

Then, voltages are applied to the shift gates SH5 and SH6. The shift gates SH3 and SH4 are set to OFF at this timing. Thereby, the charges are transferred from the charge storage portions STP to the charge detector FD via the charge transfer channels CL5 and CL6. The charge detector FD outputs a signal corresponding to the charges of the photoelectric conversion in the pixels PD5 and PD6.

OS1 shown in FIG. 4A illustrates the signal waveform output from the charge detector ED of the imaging device 1. OS2 illustrates the signal waveform output from the charge detector FD of the imaging device 2. RS illustrates the gate voltage applied to the reset gate RS.

For example, a pulse voltage is applied to the reset gate RS synchronously with the rise of the voltages applied to the shift gates SH. Thereby, the charges inside the charge detector FD are discharged to the reset drain RD; and the charge detector FD returns to the initial potential. Then, the potential of the charge detector ED gradually decreases as the charges (e.g., the electrons) that are transferred from the charge storage portions STP reaches the charge detector ED; and the charge detector ED reaches the saturation potential. Further, when the next pulse voltage is applied to the reset gate RS, the charges in the charge detector FD are discharged to the reset drain RD; and the charge detector FD returns to the initial potential.

Comparing the output signal waveforms of the imaging device 1 and the imaging device 2, the time period in which the potential of the charge detector FD is maintained at the saturation potential (i.e., the signal flat period) is longer for the imaging device 1 than that for the imaging device 2. In other words, because the distances to the charge detector FD from the shift gates SH are short, the charge transfer in the imaging device 1 is completed quickly; and the longer signal flat period can be ensured.

In the example shown in FIG. 4B, the gate voltages are applied simultaneously to the shift gates SH1 to SH6. Thereby, the charges by the photoelectric conversion in the pixels PD1 to PD6 are transferred to the charge detector FD simultaneously from the charge storage portions STP. Comparing output signals OS1 and OS2 from the charge detector FD, for such an operation as well, it can be seen that a longer signal flat period can be ensured in the imaging device 1 than a signal flat period in the imaging device 2.

In the imaging device 1 according to the embodiment, the shift gate SH2 is disposed proximally to the end portion of the charge transfer channel CL2 extending in a direction crossing the X-direction and the Y-direction. The planar configuration of the shift gate SH2 has a side orthogonal or substantially orthogonal to the extension direction of the end portion of the charge transfer channel CL2. The shift gate SH5 of the imaging device 1 also has a similar planar configuration. Due to such arrangements of the shift gates SH2 and SH5, the distances to the charge detector FD from the shift gate portions SHP can be shortened. Thereby, it is possible to reduce the charge transfer time, and to ensure the longer signal flat period.

Figure 5:
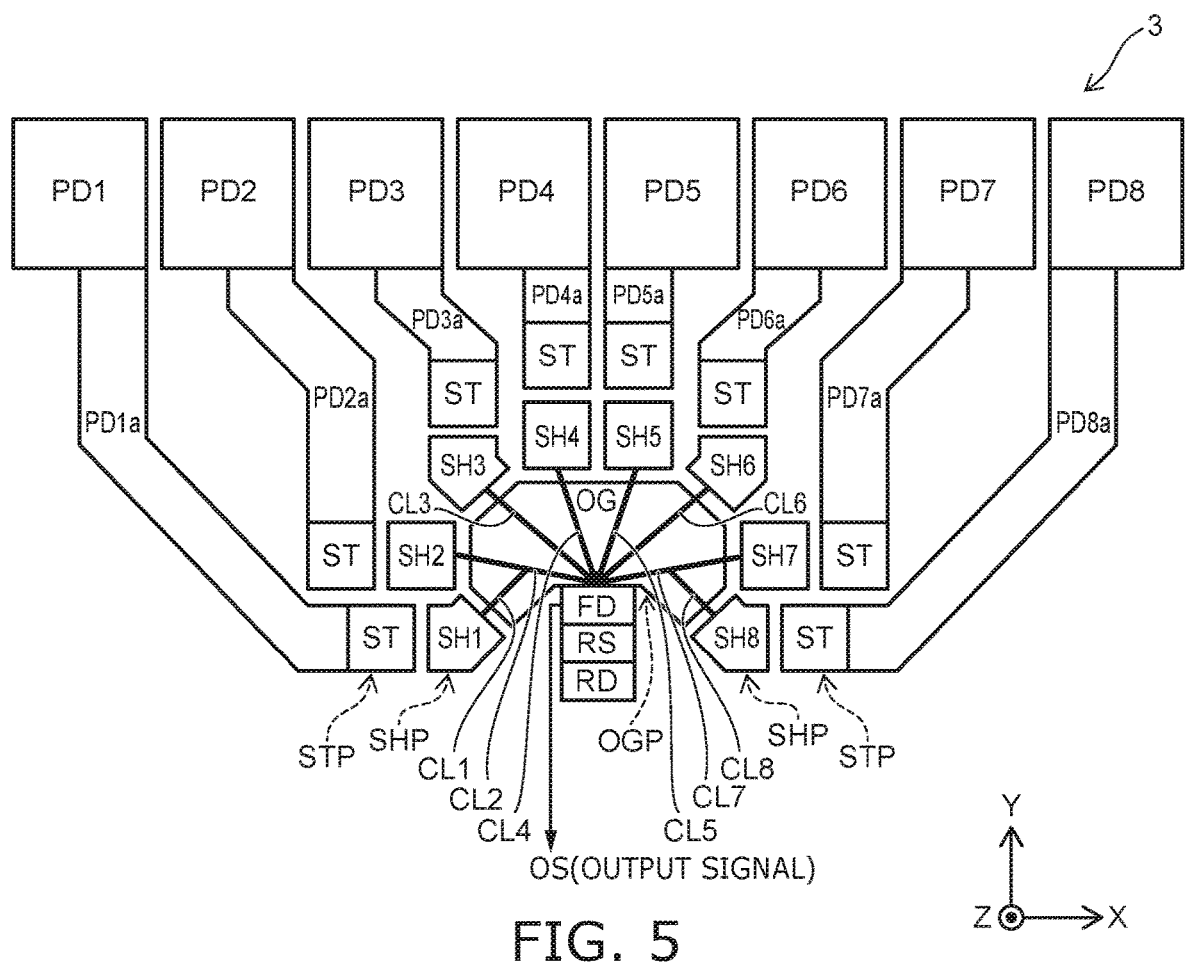
FIG. 5 is a schematic view showing an imaging device according to a modification of the first embodiment.

FIG. 5 is a schematic view showing an imaging device 3 according to a modification of the first embodiment. The imaging device 3 includes the charge detector FD and the eight pixels PD1 to PD8 arranged in the X-direction. The charge detector FD is disposed at a position separated in the −Y direction from the pixel column.

The pixels PD1 to PD8 are connected to the eight charge storage portions STP via the charge transfer portions PD1a to PD8a. The charges stored in the charge storage portions STP are transferred to the charge detector FD via the shift gate portions SHP and the output gate portion OGP. Thereby, the potential of the charge detector FD changes; and the charge detector ED outputs signals corresponding to the potential variations in the charge detector FD.

The output gate portion OGP is disposed at the vicinity of the charge detector ED. The shift gate portions SHP are provided along the outer edge of the output gate portion OGP. Eight shift gate portions SHP are provided in the example. The shift gate portions SHP each are disposed between the output gate portion OGP and the charge storage portion STP.

The arrangement of the eight storage gates ST, the shift gates SH1 to SH8, and the output gate OG is illustrated in FIG. 5. A charge storage portion STP includes a storage gate ST and a portion positioned directly under the storage gate ST. A shift gate portion SHP includes a shift gate SH and a portion positioned directly under the shift gate SH. The output gate portion OGP includes an output gate OG and a portion positioned directly under the output gate OG.

As shown in FIG. 5, the shift gates SH1 and SH8 are disposed at positions further from the pixel column than is the charge detector ED. In other words, the distances from the pixel column to the shift gate SH1 or SH8 along the −Y direction are longer than the distance from the pixel column to the charge detector ED along the −Y direction. For example, the shift gates SH2 to SH7 are disposed similarly to the shift gates SH1 to SH6 shown in FIG. 1.

The planar configuration of the shift gate SH1 has a side most proximal to the tip portion of the charge transfer channel CL1 and orthogonal or substantially orthogonal to the extension direction of the tip portion of the charge transfer channel CL1. The tip portion of the charge transfer channel CL1 extends in a direction crossing the X-direction and the Y-direction. The charge transfer channel CL1 is provided to branch from the charge transfer channel CL2 connecting the charge detector FD to the shift gate portion SHP including the shift gate SH2.

The shift gate portion SHP that includes the shift gate SH1 is provided so that the distance to the charge detector FD along portions of the channel CL1 and the channel CL2 is the same as the distance to the charge detector FD along the channel CL1 from the shift gate portion SHP including the shift gate SH2.

The planar configuration of the shift gate SH8 has a side most proximal to the tip portion of the charge transfer channel CL8 and orthogonal or substantially orthogonal to the extension direction of the tip portion of the charge transfer channel CL8. The tip portion of the charge transfer channel CL8 extends in a direction crossing the X-direction and the Y-direction. The charge transfer channel CL8 is provided to branch from the charge transfer channel CL7 connecting the charge detector FD to the shift gate portion SHP including the shift gate SH7.

The shift gate portion SHP that includes the shift gate SH8 is provided so that the distance to the charge detector FD along portions of the channel CL7 and the channel CL8 is the same as the distance to the charge detector FD along the channel CL7 from the shift gate portion SHP including the shift gate SH7.

Further, the planar configuration of the shift gate SH3 has a side most proximal to the tip portion of the charge transfer channel CL3 and orthogonal or substantially orthogonal to the extension direction of the tip portion of the charge transfer channel CL3. The tip portion of the charge transfer channel CL3 extends in a direction crossing the X-direction and the Y-direction.

Also, the planar configuration of the shift gate SH6 has a side most proximal to the tip portion of the charge transfer channel CL6 and orthogonal or substantially orthogonal to the extension direction of the tip portion of the charge transfer channel CL6. The tip portion of the charge transfer channel CL6 extends in a direction crossing the X-direction and the Y-direction.

Due to such an arrangement of the shift gates SH1 to SH8 and the charge transfer channels CL1 to CL8, the distances to the charge detector FD from the shift gates SH are formed uniformly; and the distances can be reduced. Also, the reduction of the charge transfer distance helps reduce the size of the entire imaging device and can reduce the manufacturing cost.

Second Embodiment

Figure 6:
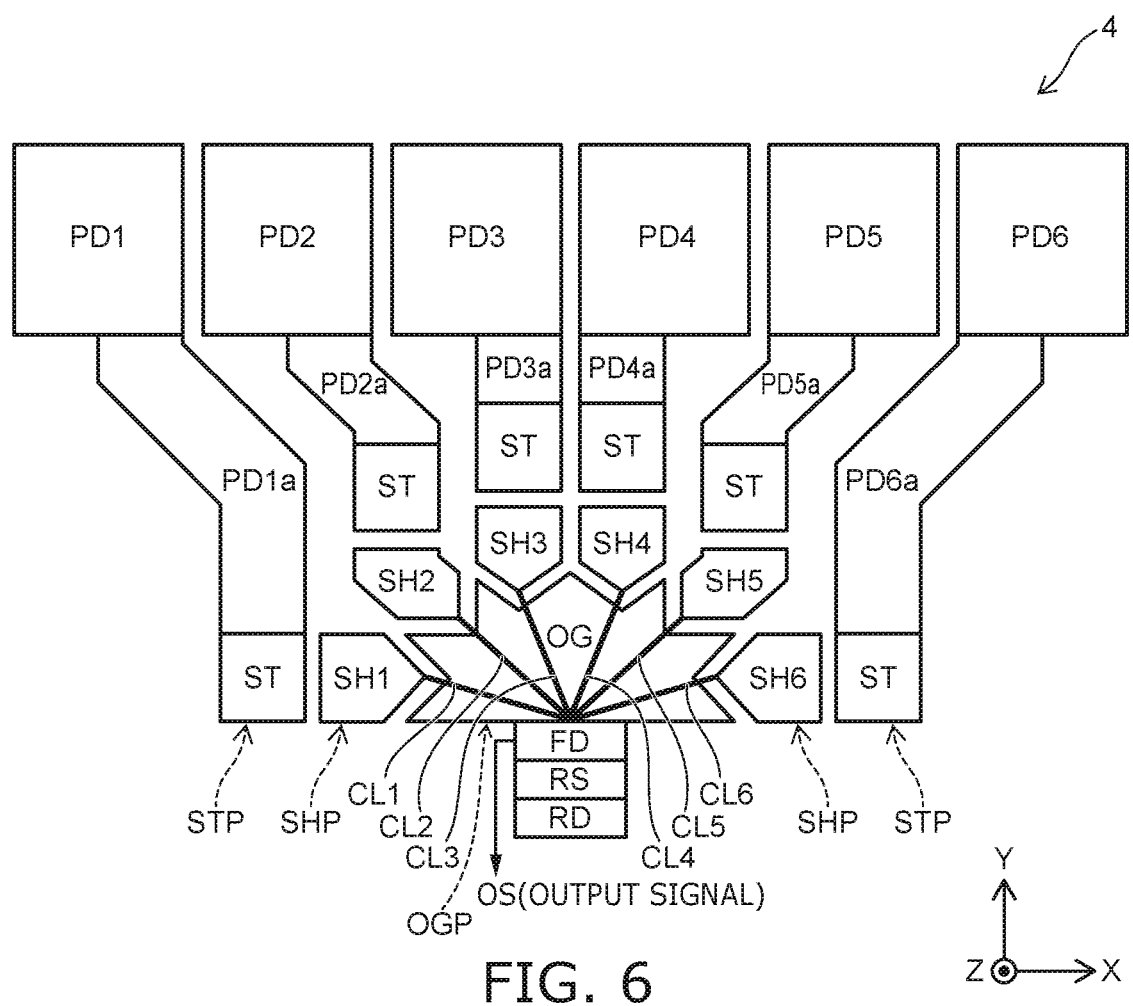
FIG. 6 is a schematic view showing an imaging device according to a second embodiment.

FIG. 6 is a schematic view showing an imaging device 4 according to a second embodiment. The imaging device 4 includes the charge detector FD and the six pixels PD1 to PD6 arranged in the X-direction. The charge detector FD is disposed at a position separated in the −Y direction from the pixel column.

The arrangement of the six storage gates ST, the shift gates SH1 to SH6, and the output gate OG is illustrated in FIG. 6. A charge storage portion STP includes a storage gate ST and a portion positioned directly under the storage gate ST. A shift gate portion SHP includes a shift gate SH and a portion positioned directly under the shift gate SH. The output gate portion OGP includes an output gate OG and a portion positioned directly under the output gate OG.

As shown in FIG. 6, the shift gates SH1 to SH6 are arranged along the outer edge of the output gate OG on the pixel column side. The output gate portion OGP includes the charge transfer channels CL1 to CL6 extending in a radial configuration from the charge detector FD toward the shift gate portions SHP.

The planar configurations of the shift gates SH1 to SH6 have corners most proximal to the tip portions of the charge transfer channels CL; and the corner portions are provided to protrude toward the interior of the output gate OG. The output gate OG is provided to have a configuration in which the outer edge of the output gate OG is recessed inward to correspond to the corner portions of the shift gates SH1 to SH6.

Due to such an arrangement of the shift gates SH1 to SH6 and the charge transfer channels CL1 to CL6, the distances to the charge detector FD from the shift gates SH are formed uniformly; and the distances can be reduced.

Figure 7:
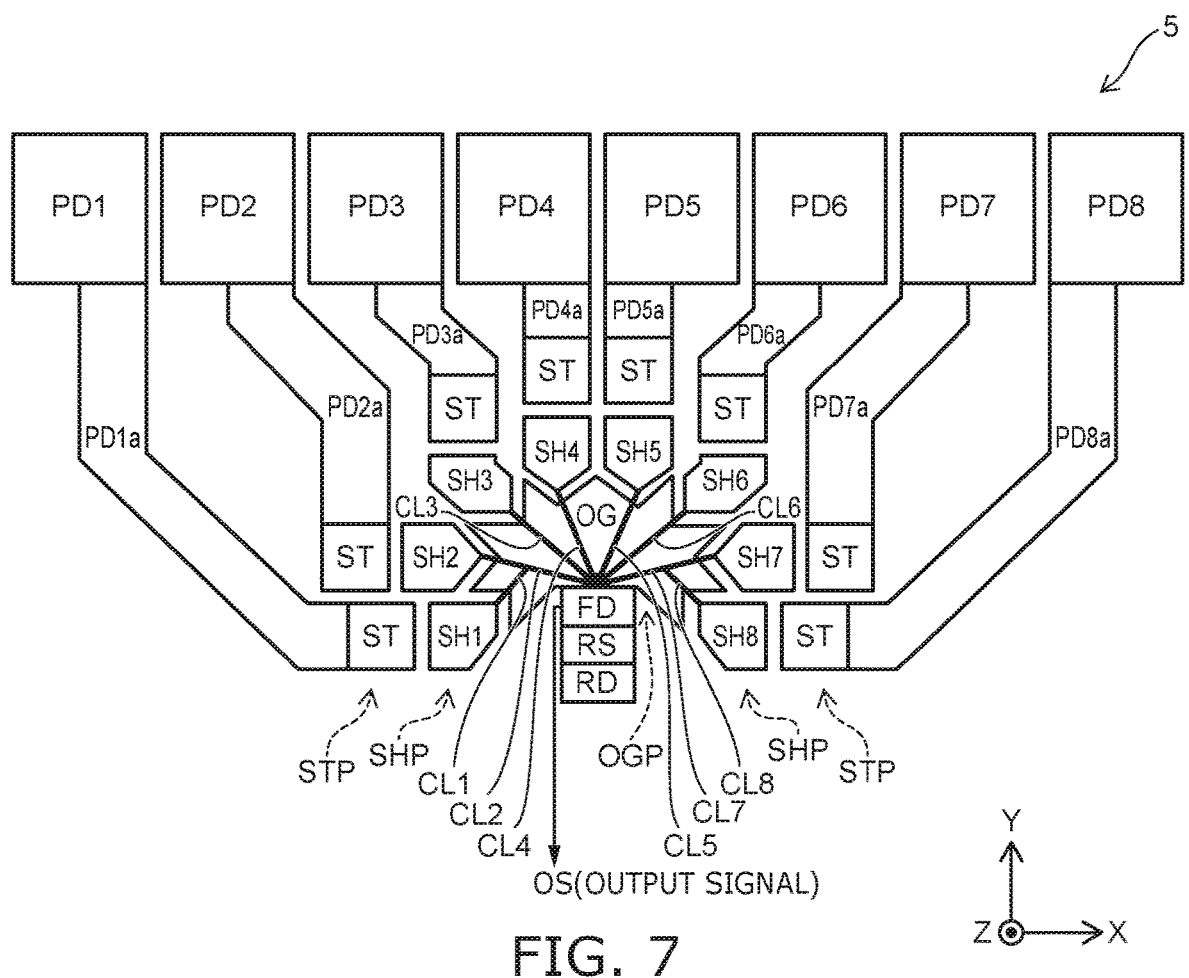
FIG. 7 is a schematic view showing an imaging device according to a modification of the second embodiment.

FIG. 7 is a schematic view showing an imaging device 5 according to a modification of the second embodiment. The imaging device 5 includes the charge detector FD and the eight pixels PD1 to PD8 arranged in the X-direction. The charge detector FD is disposed at a position separated in the −Y direction from the pixel column.

The arrangement of the eight storage gates ST, the shift gates SH1 to SH8, and the output gate OG is illustrated in FIG. 7. The shift gates SH1 and SH8 are disposed at positions further the pixel column than is the charge detector FD. In other words, the distances from the pixel column to the shift gate SH1 or SH8 along the −Y direction are longer than the distance from the pixel column to the charge detector FD along the −Y direction. For example, the shift gates SH2 to SH7 are disposed similarly to the shift gates SH1 to SH6 shown in FIG. 6.

The output gate portion OGP includes the charge transfer channels CL2 to CL7 extending in a radial configuration from the charge detector FD toward the shift gate portions SHP. The charge transfer channel CL1 is provided to branch from the charge transfer channel CL2 connecting the charge detector FD to the shift gate portion SHP including the shift gate SH2. The charge transfer channel CL8 is provided to branch from the charge transfer channel CL7 connecting the charge detector FD to the shift gate portion SHP including the shift gate SH7.

The planar configurations of the shift gates SH1 to SH8 have corners most proximal to the tip portions of the charge transfer channels CL; and the corner portions are provided to protrude toward the interior of the output gate OG. The output gate OG is provided to have a configuration in which the outer edge of the output gate OG is recessed inward to correspond to the corner portions of the shift gates SH1 to SH8.

Due to such an arrangement of the shift gates SH1 to SH8 and the charge transfer channels CL1 to CL8, the distances to the charge detector FD from the shift gates SH are formed uniformly; and the distances can be reduced. Also, the reduction of the charge transfer distance helps reduce the size of the entire imaging device and can reduce the manufacturing cost.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An imaging device, comprising:
    a semiconductor substrate;
    a plurality of pixels provided in the semiconductor substrate and arranged in a first direction along a front surface of the semiconductor substrate;
    a charge detector provided in the semiconductor substrate, the charge detector being provided at a position separated from a column of the plurality of pixels in a second direction orthogonal to the first direction;
    a plurality of charge storage portions provided on the charge detector side of the column of the plurality of pixels, the plurality of charge storage portions being linked respectively to the plurality of pixels via charge transfer portions;
    an output gate portion positioned between the charge detector and the plurality of charge storage portions, the output gate portion including a plurality of charge transfer channels extending in a radial configuration in directions from the charge detector toward the column of the plurality of pixels; and
    a shift gate portion positioned between one of the plurality of charge storage portions and a charge transfer channel of the plurality of charge transfer channels, the charge transfer channel extending in a third direction crossing the first direction and the second direction, the shift gate portion including a gate electrode provided on the semiconductor substrate, a planar configuration of the gate electrode having a side orthogonal to the third direction, the side being most proximal to the charge transfer channel extending in the third direction.

2. The device according to claim 1, wherein
the shift gate portions is provided in a plurality, and
the plurality of charge transfer channels are provided with substantially the same distances from the plurality of shift gate portions to the charge detector.

3. The device according to claim 1, wherein
the shift gate portion is provided a plurality, and
the plurality of charge transfer channels are provided to link the charge detector and the plurality of shift gate portions, respectively.

4. The device according to claim 1, wherein
the output gate portion further includes an output gate electrode provided on the plurality of charge transfer channels, and
the shift gate portion is provided in a plurality, the gate electrodes of the shift gate portions being arranged along an outer edge of the output gate electrode.

5. The device according to claim 1, wherein
the shift gate portion is provided in a plurality, the plurality of shift gate portions including a first shift gate portion and a second shift gate portion,
the first shift gate portion is provided at a position with a first distance along the second direction from the column of the plurality of pixels to the first shift gate portion, the first distance being shorter than a second distance along the second direction from the column of the plurality of pixels to the charge detector, and
the second shift gate portion is provided at a position with a third distance along the second direction from the column of the plurality of pixels to the second shift gate portion, the third distance being longer than the second distance.

6. The device according to claim 5, wherein the charge transfer channels including other charge transfer channel linking the second shift gate portion and the charge detector, the other charge transfer channel including a branch to other one of the plurality of shift gate portions.

7. The device according to claim 6, wherein the other charge transfer channel has a first transfer distance from the second shift gate portion to the charge detector and a second transfer distance from the other one of the plurality of shift gate portions to the charge detector, the first distance and the second distance being defined along the charge transfer channel, the second distance being same as the first distance.

8. The device according to claim 1, wherein the shift gate portions provide timing control of charge transfer from the plurality of charge storage portions to the charge detector.

9. The device according to claim 1, further comprising:
a charge discharging portion provided proximally to the charge detector; and
a reset gate provides timing control of charge discharging from the charge detector to the charge discharging portion.

10. The device according to claim 8, wherein a signal voltage applied to the reset gate is applied synchronously with a signal voltage applied to the gate electrode of the shift gate portion.

11. An imaging device, comprising:
a semiconductor substrate;
a plurality of pixels provided in the semiconductor substrate and arranged in a first direction along a front surface of the semiconductor substrate;
a charge detector provided in the semiconductor substrate and provided at a position separated from a column of the plurality of pixels in a second direction orthogonal to the first direction;
a plurality of charge storage portions provided on the charge detector side of the column of the plurality of pixels, the plurality of charge storage portions linked respectively to the plurality of pixels via charge transfer portions;
an output gate portion positioned between the charge detector and the plurality of charge storage portions, the output gate portion including a plurality of charge transfer channels extending in a radial configuration in directions from the charge detector toward the column of the plurality of pixels; and
a shift gate portion positioned between one of the plurality of charge storage portions and one charge transfer channel of the plurality of charge transfer channels, the shift gate portion including a gate electrode provided on the semiconductor substrate,
a planar configuration of the gate electrode having a corner most proximal to an end of the one charge transfer channel, the one charge transfer channel being connected to the shift gate portion at a vicinity of the corner.

12. The device according to claim 11, wherein
the output gate portion further includes an output gate electrode provided on the plurality of charge transfer channels, and
the output gate electrode has a recess at an outer edge of the output gate electrode, the recess corresponding to the corner of the gate electrode.

13. The device according to claim 11, wherein
the shift gate portion is provided in a plurality, and
the plurality of charge transfer channels is provided with substantially the same distances from the plurality of shift gate portions to the charge detector.

14. The device according to claim 11, wherein
the shift gate portion is provided in a plurality, and
the plurality of charge transfer channels is provided to link the charge detector and the plurality of shift gate portions, respectively.

* * * * *